United States Patent
Snyder et al.

(10) Patent No.: US 7,176,106 B2
(45) Date of Patent: Feb. 13, 2007

(54) WAFER BONDING USING REACTIVE FOILS FOR MASSIVELY PARALLEL MICRO-ELECTROMECHANICAL SYSTEMS PACKAGING

(75) Inventors: Tanya Jegeris Snyder, Edina, MN (US); Robert H. Yi, Palo Alto, CA (US); Robert Edward Wilson, Palo Alto, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 80 days.

(21) Appl. No.: 10/461,291

(22) Filed: Jun. 13, 2003

(65) Prior Publication Data
US 2004/0251524 A1 Dec. 16, 2004

(51) Int. Cl.
*H01L 21/30* (2006.01)
*H01L 21/46* (2006.01)

(52) U.S. Cl. ............................ 438/455; 438/456
(58) Field of Classification Search ............ 257/678, 257/680, 684, 685, 720, 723; 438/106, 107, 438/110, 109, 116, 121, 119, 455, 800, 50, 438/113, 118, 456
See application file for complete search history.

(56) References Cited

U.S. PATENT DOCUMENTS

| | | | | | |
|---|---|---|---|---|---|
| 4,611,610 A | * | 9/1986 | Schepis | .................. | 132/251 |
| 5,227,583 A | * | 7/1993 | Jones | .................. | 174/52.4 |
| 5,576,147 A | * | 11/1996 | Guckel et al. | .............. | 430/313 |
| 6,133,065 A | * | 10/2000 | Akram | .................. | 438/108 |
| 6,232,150 B1 | * | 5/2001 | Lin et al. | .................. | 438/119 |
| 6,436,853 B2 | | 8/2002 | Lin et al. | | |
| 6,534,340 B1 | * | 3/2003 | Karpman et al. | .......... | 438/113 |
| 6,537,846 B2 | * | 3/2003 | Lee et al. | .................. | 438/102 |
| 6,558,968 B1 | * | 5/2003 | Ramamoorthi et al. | ....... | 438/20 |
| 6,607,934 B2 | * | 8/2003 | Chang et al. | ................ | 438/50 |
| 6,635,509 B1 | * | 10/2003 | Ouellet | ..................... | 438/106 |
| 6,660,564 B2 | * | 12/2003 | Brady | ..................... | 438/119 |
| 6,673,697 B2 | * | 1/2004 | Ma et al. | .................. | 438/455 |
| 6,736,942 B2 | * | 5/2004 | Weihs et al. | ................ | 427/289 |
| 2001/0038029 A1 | | 11/2001 | Weihs et al | | |
| 2001/0046597 A1 | | 11/2001 | Weihs et al. | | |
| 2003/0071347 A1 | * | 4/2003 | Wang et al. | ................ | 257/706 |
| 2003/0089394 A1 | * | 5/2003 | Chang-Chien et al. | ....... | 137/14 |

FOREIGN PATENT DOCUMENTS

WO WO 01/83182 11/2001
WO WO 01/83205 11/2001

OTHER PUBLICATIONS

David W. Oxtoby et al., "Thermodynamic Processes and Thermochemistry," Principles of Modern Chemisty, 2nd edition, Saunders College Publishing, p. 288 (3 pages enclosed).

(Continued)

*Primary Examiner*—Thien F. Tran

(57) ABSTRACT

A method for forming device packages includes forming a perimeter comprising a reactive foil and a bonding material interposed between a first wafer and a second wafer, pressing the first and the second wafers against the reactive foil and the bonding material, initiating the reactive foil, wherein the reactive foil heating the bonding material to create a bond between the first and the second wafers, and singulating the first and the second wafers into the device packages.

25 Claims, 6 Drawing Sheets

OTHER PUBLICATIONS

"Exothermic reaction," from Wikipedia, the free encyclopedia, downloaded on Feb. 15, 2006 from http://en.wikipedia.org/wiki/Exothermic_reaction, pp. 1-2.

"Exothermic reaction," from Wikipedia, the free encyclopedia, downloaded on Feb. 15, 2006 from http://en.wikipedia.org/wiki/Exothermic_reaction, pp. 1-2.

* cited by examiner

WAFER BONDING USING REACTIVE FOILS FOR MASSIVELY PARALLEL MICRO-ELECTROMECHANICAL SYSTEMS PACKAGING

FIELD OF INVENTION

This invention relates to the use of reactive foils for wafer bonding and for forming device packages.

DESCRIPTION OF RELATED ART

Wafer bonding techniques are used in IC (integrated circuit) and MEMS (micro-electromechanical systems) manufacturing. By achieving package function at the wafer level, it is possible to realize cost savings via massive parallel assembly. While MEMS packaging has been incorporated at the device fabrication stage of the micromachining process, there is a need for a more uniform packaging process to produce higher yields and to lower costs. Hermeticity and low-temperature sealing are two key elements that present formidable challenges to the goal of process uniformity.

MEMS devices and IC's are generally fragile devices that are sensitive to high temperatures and high voltages required for conventional wafer bonding techniques. Conventional wafer bonding techniques include anodic bonding, intermediate-layer bonding, and direct bonding. Anodic bonding typically takes place at 300 to 450° C. and requires the application of high voltages. Direct bonding typically takes place at 1000° C. and requires extremely good surface flatness and cleanliness. Intermediate-layer bonds are typically formed with brazes or solders such as AuSi (gold silicon), AuGe (gold germanium), and AuSn (gold tin). All of these brazes and solders have melting temperatures that can degrade temperature sensitive materials and devices.

Thus, what is needed is a method that bonds wafers without exposing MEMS devices and IC's to high temperatures and high voltages.

SUMMARY

In one embodiment of the invention, a method for forming device packages includes forming a perimeter comprising a reactive foil and a bonding material interposed between a first wafer and a second wafer, pressing the first and the second wafers against the reactive foil and the bonding material, initiating the reactive foil whereby the reactive foil heats the bonding material to create a bond between the first and the second wafers, and singulating the first and the second wafers into the device packages.

DETAILED DESCRIPTION

In accordance with one aspect of the invention, devices packages are formed with reactive foils at both the die and wafer levels. In one embodiment of the invention, a reactive foil and a bonding material are patterned to form one or more perimeters around devices atop a first wafer. A second wafer is aligned with the first wafer and the reactive foil is initiated to start an exothermic reaction that releases heat. The heat from the reactive foil is localized away from the devices. The heat melts the bonding material to form a bond between the first and the second wafers. The bonded wafer structure is singulated to form individual packages containing the devices.

Figure 1:
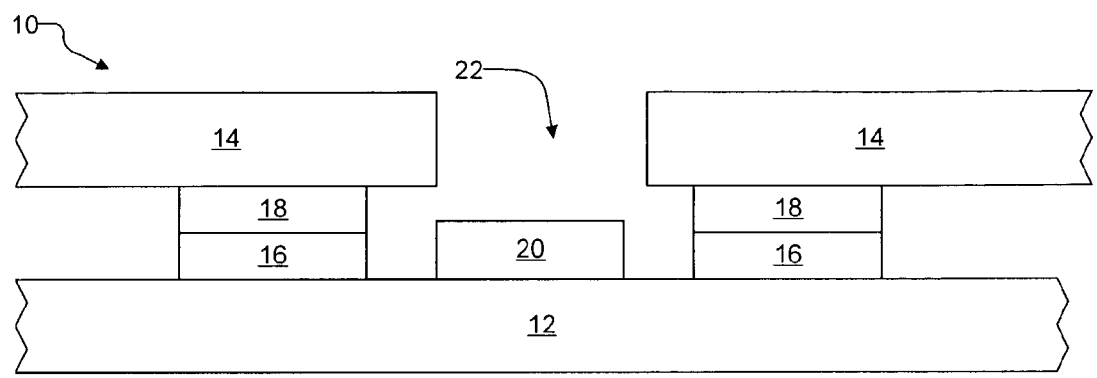
FIGS. 1, 2, and 3 illustrate cross-sections of wafer structures for forming device packages in various embodiments of the invention.

FIG. 1 illustrates a cross-section of a structure 10 that forms one or more device packages in one embodiment of the invention. Structure 10 includes a base wafer 12 and a cover wafer 14. Depending on the application, one or both of wafers 12 and 14 can have bulk or surface micro-machined features. Micro-machined features include electronic devices, electromechanical sensors, micro-actuators, optical components, and mechanical alignment marks.

A reactive foil 16 is formed atop wafer 12. Reactive foil 16 includes alternating layers of reactive materials (e.g., aluminum and nickel) that produces an exothermic reaction when initiated. Reactive foil 16 can be formed atop wafer 12 by magnetron sputtering and patterned by methods described later in the present disclosure. For more details on reactive foils, please refer to (1) International Application No. PCT/US01/14052, International Publication No. WO 01/83205, published Nov. 8, 2001, (2) International Application No. PCT/US01/14053, International Publication No. WO 01/83182, (3) US patent application Ser. No. 09/846,422, US Patent Application Publication No. US 2001/0038029, published Nov. 8, 2001, (4) US patent application Ser. No. 09/846,447, US Patent Application Publication No. US 2001/0046597, published Nov. 29, 2001.

Figure 1A:
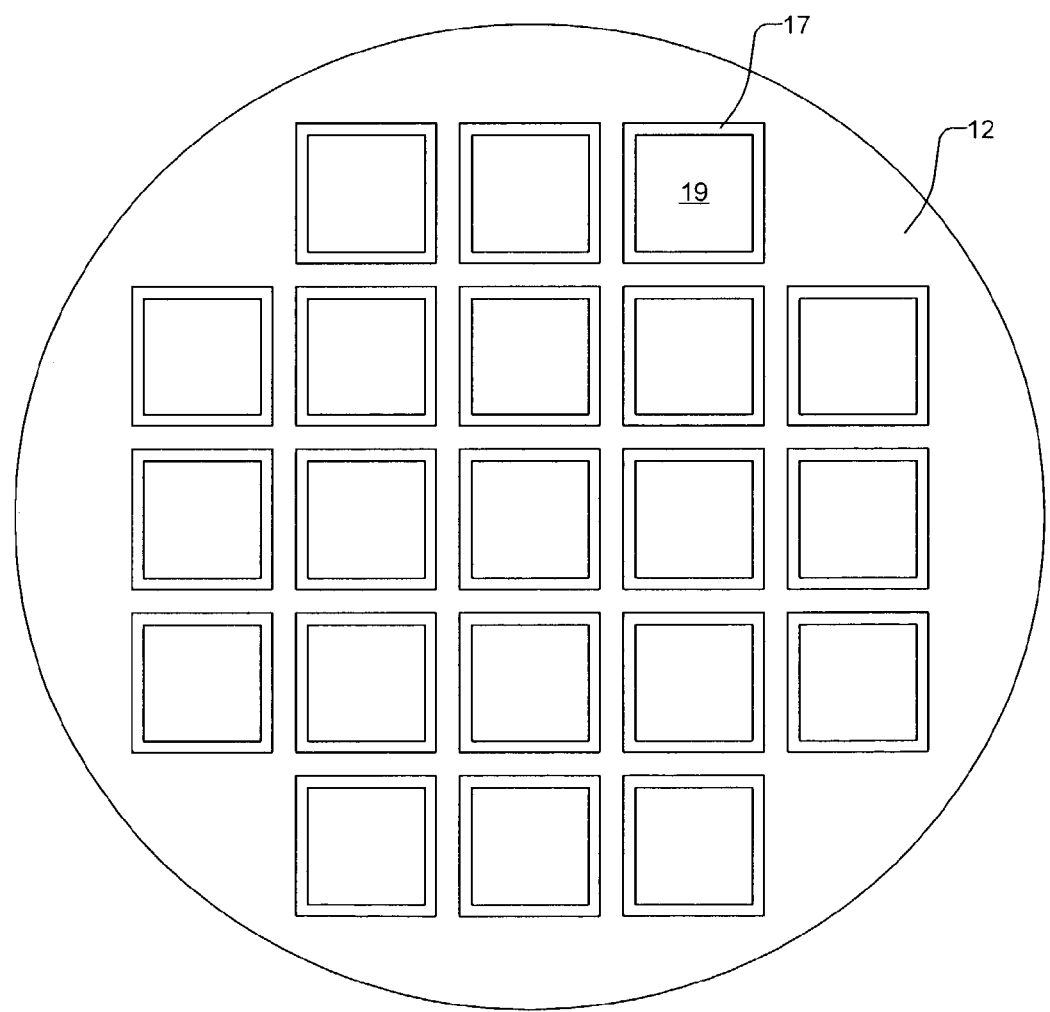
FIG. 1A illustrates a top view of the pattern formed by the reactive foil and the bonding material around devices on a wafer in one embodiment of the invention.

A bonding material 18 is next formed atop reactive foil 16. Bonding material 18 can be a solder, a braze, or any other bonding agent requiring heat to transform the bonding material into its final state. Bonding material 18 can be formed atop reactive foil 16 by evaporation or sputtering. Reactive foil 16 and bonding material 18 are then patterned to form part of one or more perimeters 17 (FIG. 1A) around device areas 19 (FIG. 1A) on wafer 12. Wafers 12 and 14 are then aligned to the required accuracy. A nominal force is applied to press wafers 12 and 14 against reactive foil 16 and bonding material 18. This prevents movement of wafers 12 and 14 when reactive foil 16 is initiated. Reactive foil 16 is initiated to provide a localized heat source for bonding material 18. As a result, bonding material 18 bonds wafers 12 and 14. After the exothermic reaction, reactive foil 16 leaves behind an intermetallic mixture consisting of the materials from the reactive foil (e.g., aluminum and nickel) and the bonding material.

Alternatively, bonding material 18 (e.g., solder) can be deposited atop reactive foil 16 by plating or screen printing, instead of evaporation or sputtering, after reactive foil 16 has been patterned. A photoresist, such as a plating or screen printing mask, is first applied to areas that do not need solder and then the entire device or wafer is plated or screen printed with bonding material 18 to form the desired bond lines. The photoresist mask is then cleaned off. Plating or screen printing offers a cost advantage over evaporation and sputtering of the bonding material.

Bonding wafers 12 and 14 form a partial package for an electronic device such as an IC laser, a MEMS device such as an electromechanical sensor, or an optoelectronic device such as a semiconductor laser (e.g., Fabry-Perot, distributed feedback, vertical cavity surface emitting lasers), light emitting diodes, and photodetectors (e.g., positive-intrinsic-negative photodetectors and monitor diodes). After the reactive foil bonding, a device 20 is placed, aligned, and bonded to base wafer 12 through a hole 22 in cover wafer 14. Although not shown in FIG. 1, one skilled in the art understands there are multiple devices 20 in structure 10. Structure 10 is singulated to form individual device packages.

Figure 2:
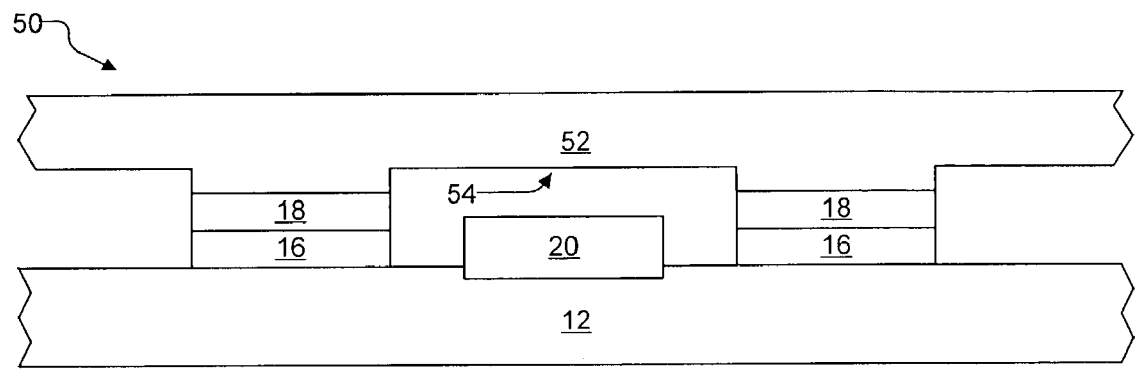

FIG. 2 illustrates a cross-section of a structure 50 that forms one or more device packages in another embodiment of the invention. Structure 50 includes base wafer 12 and a cover wafer 52. In this embodiment, base wafer 12 has device 20 constructed thereon or placed, aligned, and bonded prior to reactive foil bonding. Furthermore, cover wafer 52 has a cavity 54 to accommodate device 20. Depending on the application, wafers 12 and 14 can also have other bulk or surface micro-machined features.

As similarly described above, wafers 12 and 52 are bonded using reactive foil 16 and bonding material 18. Bonding wafers 12 and 52 may form a complete hermetic package for electronic and MEMS devices. As one skilled in the art understands, structure 50 may include multiple devices 20 and may be singulated to form individual device packages.

Figure 3:
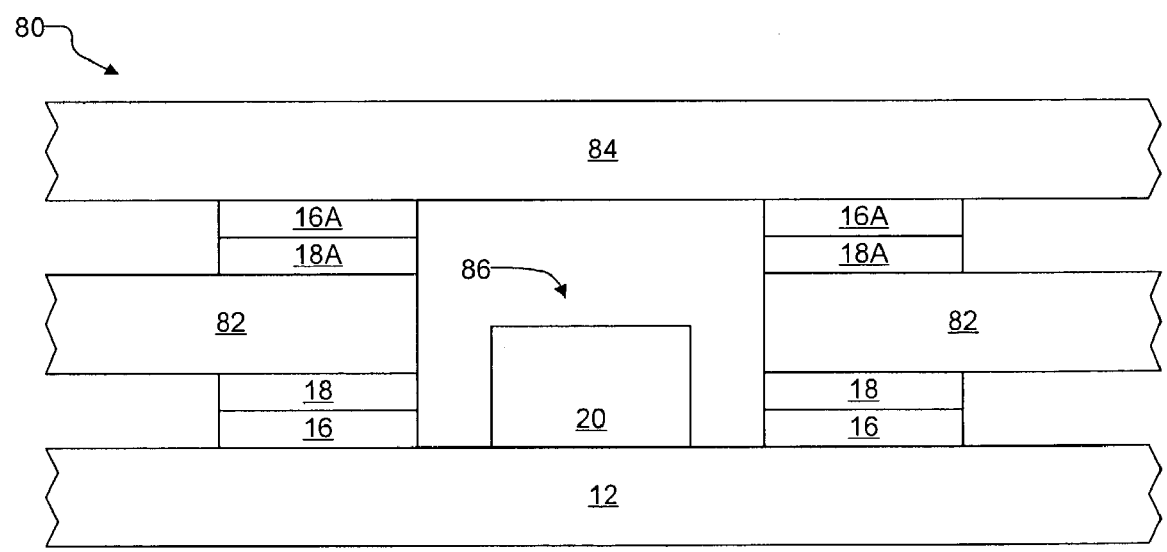

FIG. 3 illustrates a cross-section of a structure 80 that forms one or more device packages in another embodiment of the invention. Structure 80 includes base wafer 12, an intermediate ring wafer 82, and a cover wafer 84. Depending on the application, wafers 12, 82, and 84, can have bulk or surface micro-machined features.

Wafers 12 and 82 are bonded using reactive foil 16 and bonding material 18. Reactive foil 16 and bonding material 18 are formed atop wafer 12 and then patterned to form perimeters 17 (FIG. 1A) on wafer 12. Wafers 12 and 82 are then aligned to the required accuracy. A nominal force is applied to press wafers 12 and 82 against reactive foil 16 and bonding material 18. This prevents movement of wafers 12 and 82 when reactive foil 16 is initiated. Reactive foil 16 is then initiated and, as a result, bonding material 18 creates a bond between wafers 12 and 82.

Device 20 is next placed, aligned, and bonded to base wafer 12 through a hole 86 in ring wafer 82. Wafers 82 and 84 are then bonded using a reactive foil 16A and a bonding material 18A. Reactive foil 16A and bonding material 18A are formed atop cover wafer 84 and then patterned to form perimeters on cover wafer 84. These perimeters on cover wafer 84 correspond to and are located opposite of perimeters 17 (FIG. 1A) on wafer 12. Wafers 82 and 84 are then aligned to the required accuracy. A nominal force is applied to press wafers 82 and 84 against reactive foil 16A and bonding material 18A. This prevents movement of wafers 82 and 84 when reactive foil 16A is initiated. Reactive foil 16A is then initiated and, as a result, bonding material 18A creates a bond between wafers 82 and 84.

Bonding wafers 12, 82, and 84 may form a complete hermetic package for electronic and MEMS devices. As one skilled in the art understands, structure 80 may include multiple devices 20 and may be singulated to form individual device packages.

In accordance with another aspect of the invention, a method is provided to pattern the reactive foil. Patterning the reactive foil is difficult because it is reactively thick (e.g., 20 to 100 microns) compared to conventional metal layers (e.g., 1 micron) in semiconductor processing. In one embodiment of the invention, two layers of photoresist form a lift-off mask used to pattern the reactive foil. In another embodiment of the invention, a mechanical lift-off mask is used to pattern the reactive foil. In yet another embodiment of the invention, a lithographic etch is used to pattern the reactive foil.

Figure 4A:
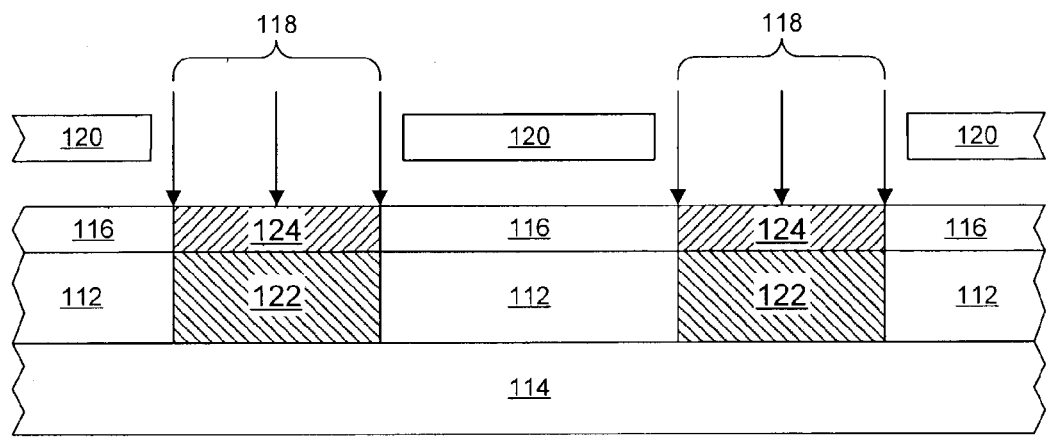
FIGS. 4A, 4B, 4C, and 4D illustrate the resulting cross-sections of a wafer structure formed by a method in one embodiment of the invention.
Figure 4B:
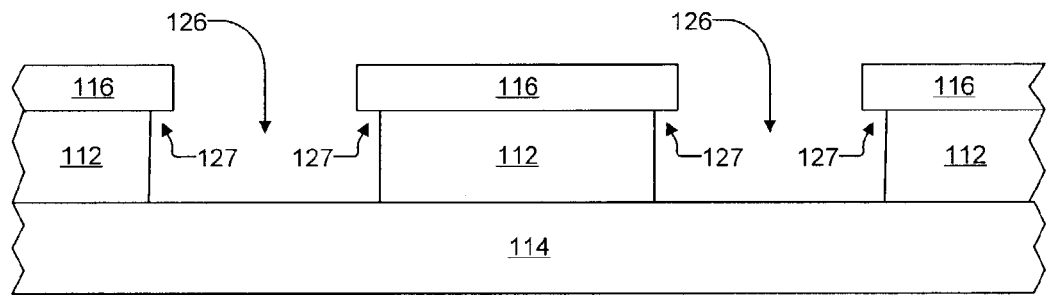

FIGS. 4A to 4D illustrate a method to pattern a reactive foil in one embodiment of the invention. Referring to FIG. 4A, a first photoresist layer 112 is formed atop a wafer 114. A second photoresist layer 116 is then formed atop of photoresist 112. The material of photoresist 116 is selected to develop at a slower rate than photoresist 112. Regions 122 of photoresist 112 and regions 124 of photoresist 116 are exposed to light 118 through a mask or reticle 120. Photoresists 112 and 116 are then developed to form windows 126 through photoresists 116 and 112 as shown in FIG. 4B. As a result of the different development rate, photoresist 116 forms overhangs 127 above photoresist 112.

Figure 4C:
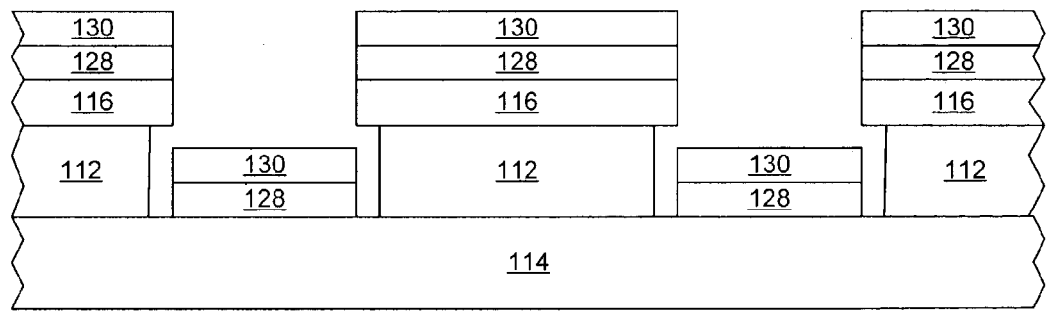

Referring to FIG. 4C, a reactive foil 128 is deposited atop photoresist 116 and through windows 126 onto wafer 114. Reactive foil 128 can be deposited by sputtering. Bonding material 130 is next deposited atop reactive foil 128. Bonding material 120 can be deposited by evaporation or sputtering. Overhangs 127 (FIG. 4B) prevents a continuous layer of reactive foil 128 and bonding material 130 to form over wafer 114.

Figure 4D:
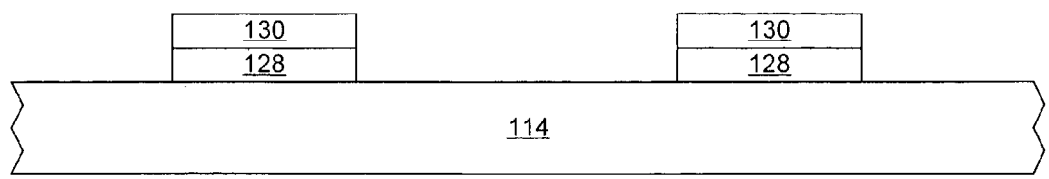

Referring to FIG. 4D, photoresists 116 and 112 are stripped, and reactive foil 128 and bonding material 130 thereon are lifted off. The remaining reactive foil 128 and bonding material 130 on wafer 114 form the desired bond pattern (e.g., perimeters 17 in FIG. 1A) between wafer 114 and another wafer (e.g., a ring or a cover wafer).

In another embodiment, instead of using two photoresist layers with different development rates, the top photoresist layer can be treated with chlorobenzene to reduce its development rate to achieve the undercut profile. Alternatively, a single thick photoresist layer can have its top surface treated with chlorobenzene to achieve the undercut profile.

In yet another embodiment, bonding material 130 is plated or screen printed on top of reactive foil 128 after reactive foil 128 alone has been deposited and patterned with the steps shown in FIGS. 4A to 4D.

Figure 5A:
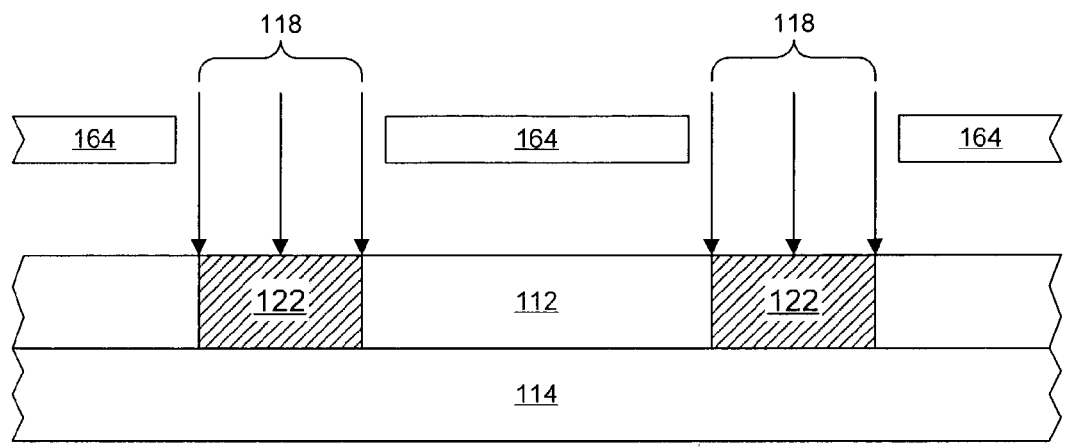
FIGS. 5A and 5B illustrate the resulting cross-sections of a wafer structure formed by a method in another embodiment of the invention.
Figure 5B:
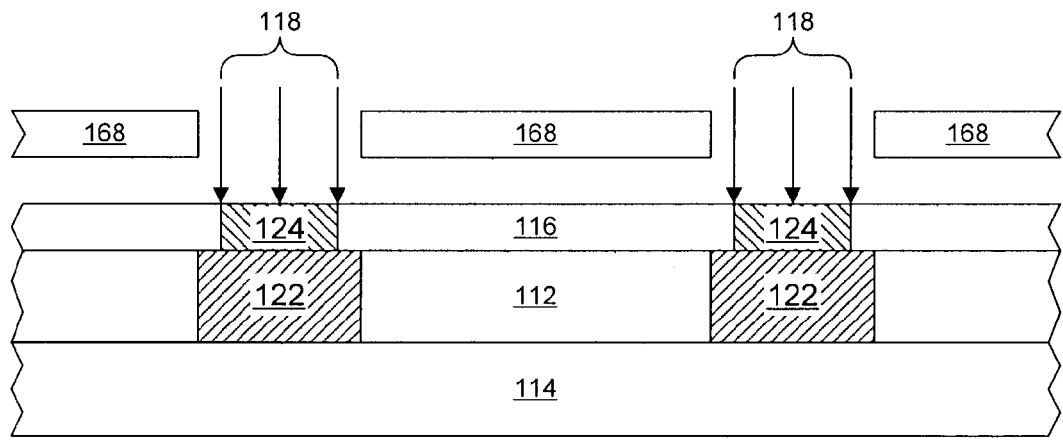

FIGS. 5A and 5B illustrate another method to pattern a reactive foil in one embodiment of the invention. Referring to FIG. 5A, photoresist layer 112 is formed atop wafer 114. Photoresist 112 is patterned by exposing regions 122 to light 118 through a mask or reticle 164.

Referring to FIG. 5B, photoresist layer 116 is formed atop photoresist 112. In this embodiment, photoresists 112 and 116 can have the same development rate. Photoresist 116 is patterned by exposing regions 124 to light 118 through a mask or reticle 168. Reticle 168 has smaller windows than reticle 164. Thus, region 124 is smaller than region 122.

Regions 122 and 124 are then developed to form windows 126 with overhangs 127 as shown in FIG. 4B. Reactive foil 128 and bonding material 130 are next formed and then patterned with the remaining photoresists 112 and 116 as described above in reference to FIGS. 4C and 4D. Alternatively, bonding material 130 can be plated or screen printed on top of reactive foil 128 after reactive foil 128 alone has been deposited and patterned with the steps shown in FIGS. 5A and 5B.

Figure 6:
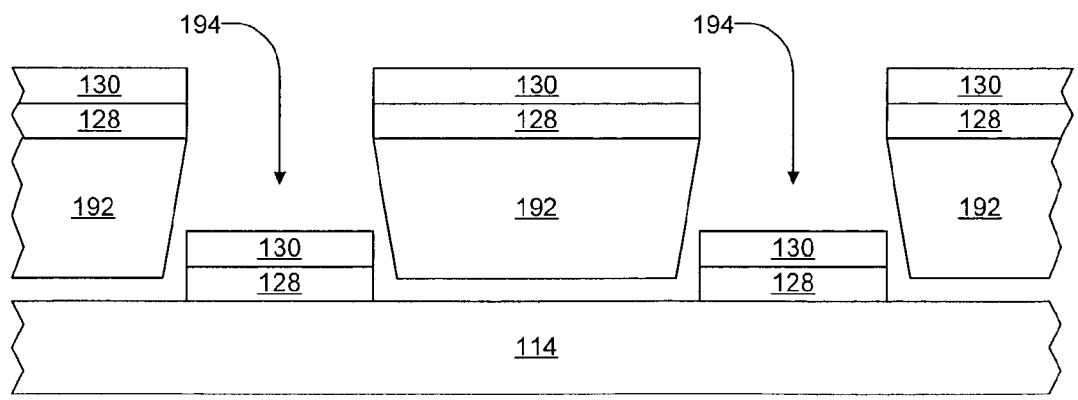
FIG. 6 illustrates the resulting cross-section of a wafer structure formed by a method in another embodiment of the invention.

FIG. 6 illustrates another method to pattern a reactive foil in one embodiment of the invention. In this embodiment, a mechanical mask or stencil 192 is used to pattern reactive foil 128 and bonding material 130. Mask 192 can be made of stainless steel, glass, or silicon wafer into which undercut windows 194 are machined or etched. Reactive foil 128 and bonding material 130 are deposited through windows 194 to form the desired bond pattern. The excess reactive foil 128 and bonding material deposited on mask 192 can be stripped so mask 192 can be reused. Alternatively, bonding material 130 can be plated or screen printed on top of reactive foil 128 after reactive foil 128 alone has been deposited and patterned with the steps shown in FIG. 6.

Figure 7A:
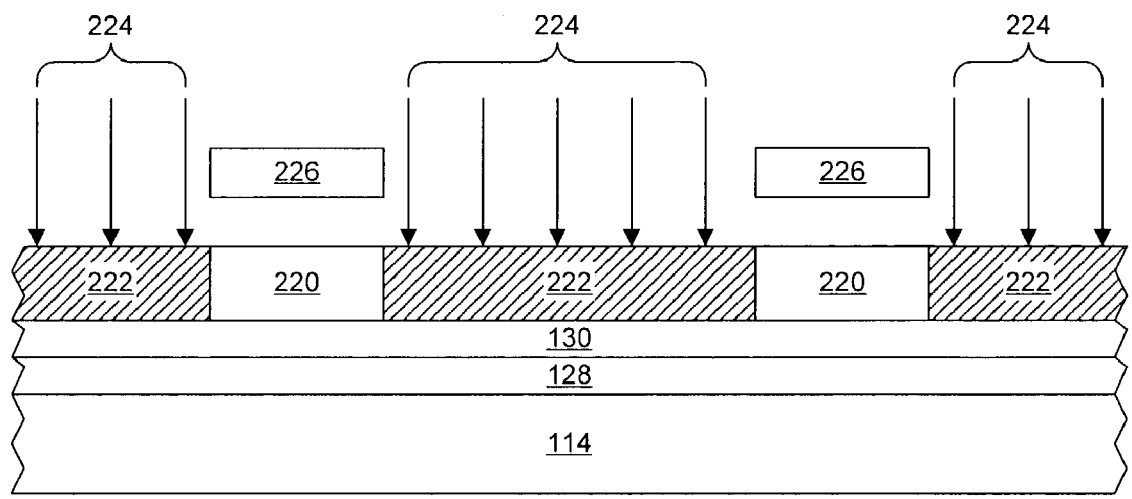
FIGS. 7A and 7B illustrate the resulting cross-sections of a wafer structure formed by a method in another embodiment of the invention.
Figure 7B:
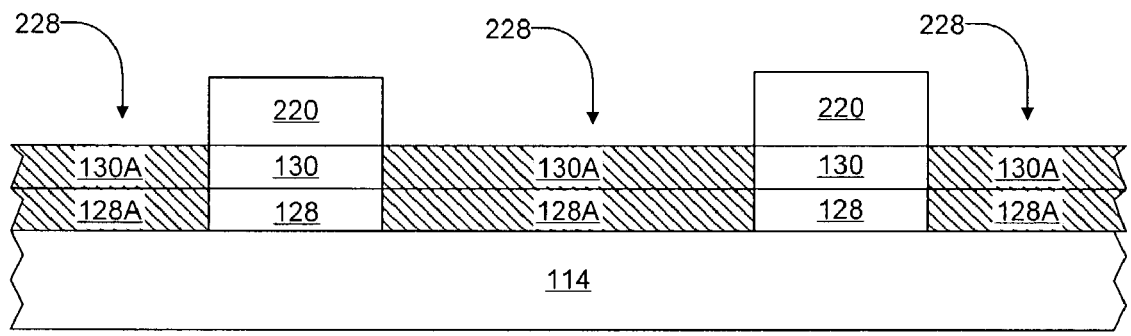

FIGS. 7A and 7B illustrate another method to pattern a reactive foil in one embodiment of the invention. Referring to FIG. 7A, reactive foil 128 is formed over wafer 114. Bonding material 130 is formed atop reactive foil 128. Bonding material 130 can be deposited on top of reactive foil 128 by evaporation or sputtering. Alternatively bonding material 130 can be plated or screen printed on top of reactive foil 128. A photoresist layer 220 is formed atop bonding material 130. Photoresist 220 is then patterned by exposing regions 222 to light 224 through a mask or reticle 226.

Regions 222 are then developed to form etching windows 228 in photoresist 220. Regions 128A and 130A left unprotected by the remaining photoresist 220 are etched away, and the remaining photoresist 220 is stripped, to form the structure shown in FIG. 4D.

Figure 8:
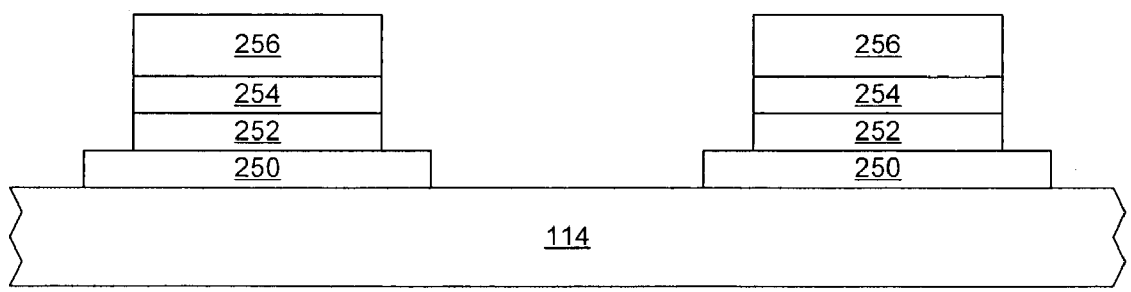
FIG. 8 illustrates the resulting cross-section of a wafer structure formed by a method in another embodiment of the invention.

In accordance with another aspect of the invention, a reactive foil is used to bond a large number of devices, such as IC lasers, in a parallel fashion. Referring to FIG. 8, wafer 114 is bulk or surface micro-machined according to the specific application. A metal layer 250 is formed and patterned to form metal lines atop wafer 114. A reactive foil 252 and a conductive bonding material 254 are formed and patterned atop metal layer 250. Reactive foil 252 and bonding material 254 can be patterned by any of the methods described above.

Devices 256 are aligned and placed atop bonding material 254. A nominal force is applied to press device 256 and wafer 114 against reactive foil 252 and bonding material 254. This prevents movement of devices 256 and wafer 114 when reactive foil 252 is initiated. Reactive foil 252 is then initiated to heat bonding material 254. As a result, bonding material 254 forms a bond between devices 256 and their corresponding metal 250. After the exothermic reaction, reactive foil 252 leaves behind an intermetallic mixture consisting of the materials from the reactive foil (e.g., aluminum and nickel) and the bonding material. The steps described above can be used to bond the devices in FIGS. 1, 2, and 3 to their base wafers.

Figure 9A:
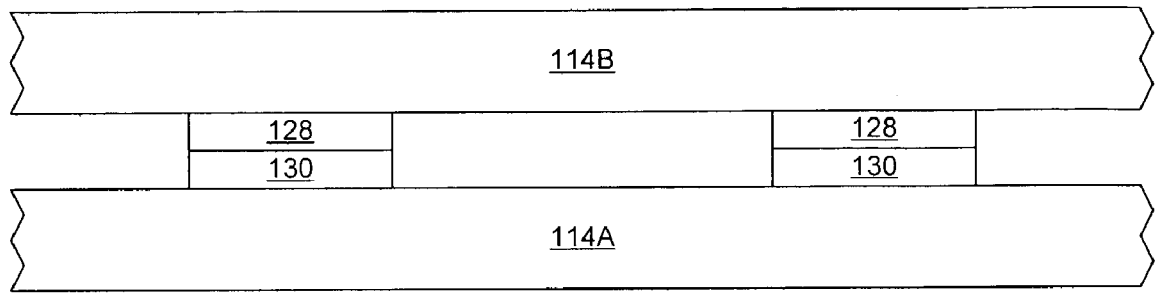
FIGS. 9A and 9B illustrate alternative layer geometries for the reactive foil and the bonding material in embodiments of the invention.
Figure 9B:
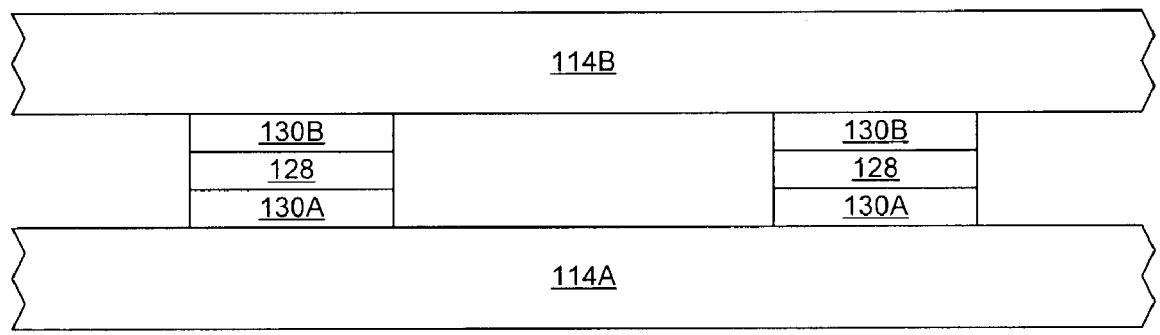

In the embodiments described above, the layer geometry consists of a bonding material (e.g., solder) on top of a reactive foil. However, different layer geometries can be used to bond the wafers and to form device packages. FIG. 9A illustrates a layer geometry where reactive foil 128 is formed on top of bonding material 130 interposed between wafers 114A and 114B to bond the wafers. FIG. 9B illustrates a layer geometry where a sandwich of bonding material 130A, reactive foil 128, and bonding material 130B is interposed between wafers 114A and 114B to bond the wafers. Furthermore, this layer geometry may be repeated.

Various other adaptations and combinations of features of the embodiments disclosed are within the scope of the invention. Numerous embodiments are encompassed by the following claims.

What is claimed is:

1. A method for forming device packages, comprising:
    forming a perimeter by depositing (1) alternating layers of reactive materials that form a reactive foil and (2) a bonding material on a first wafer;
    pressing the first wafer and a second wafer against the reactive foil and the bonding material;
    initiating the reactive foil so the reactive foil undergoes an exothermic reaction that heats the bonding material, the heated bonding material creating a bond between the first and the second wafers; and
    singulating the first and the second wafers into device packages.

2. The method of claim 1, wherein said forming a perimeter comprises:
    forming a first photoresist layer atop the first wafer, the first photoresist layer having a first development rate;
    forming a second photoresist layer atop the first photaresist layer, the second photoresist layer having a second development rate, the second development rate being slower than the first development rate;
    exposing the first and the second photoresist layers to a pattern;
    removing exposed regions of the first and the second photoresist layers to form a window to the first wafer, the window including an undercut profile;
    depositing the reactive foil atop unexposed regions of the first and second photoresist layers and through the window onto the first wafer; and
    stripping the unexposed regions of first and the second photoresist layers, to lift off the reactive foil thereon.

3. The method of claim 2, wherein said forming a perimeter further comprises:
    depositing the bonding material on the reactive foil through the window, wherein said stripping also lifts off the bonding material on the first and the second photoresist layers.

4. The method of claim 2, wherein said forming a perimeter further comprises:
    patterning a mask on the first wafer;
    depositing the bonding material over the first wafer, wherein said depositing is a step selected from the group consisting of plating and screen printing; and
    stripping the mask to lift off the bonding material thereon.

5. The method of claim 1, wherein said forming a perimeter comprises:
    forming a first photoresist layer atop the first wafer;
    defining a first region of the first photoresist layer to be removed;
    forming a second photoresist layer atop the first photoresist layer;
    defining a second region of the second photoresist layer to be removed, the second region being above the first region, the second region being smaller than the first region;

removing the first and the second regions to form a window to the first wafer, the window including an undercut profile;

depositing the reactive foil through the window onto the first wafer; and stripping remaining regions of first and the second photoresist layers to lift off the reactive foil thereon.

6. The method of claim 5, wherein said Conning a perimeter further comprises:

depositing the bonding material on the reactive foil through the window, wherein said stripping also lifts off the bonding material on the first and the second photoresist layers.

7. The method of claim 5, wherein said forming a perimeter further comprises:

patterning a mask on the first wafer;

depositing the bonding material over the first wafer, wherein said depositing is a step selected from the group consisting of plating and screen printing; and stripping the mask to lift off the bonding material thereon.

8. The method of claim 1, wherein said forming a perimeter comprises:

placing a mechanical mask over the first wafer, the mechanical mask comprising a window, the window including an undercut profile;

depositing the reactive foil through the window onto the first wafer.

9. The method of claim 8, wherein said forming a perimeter further comprises:

depositing the bonding material on the reactive foil through the window, wherein said stripping also lifts off the bonding material on the first and the second photoresist layers.

10. The method of claim 8, wherein said forming a perimeter further comprises:

patterning a mask on the first wafer;

depositing the bonding material over the first wafer, wherein said depositing is a step selected from the group consisting of plating and screen printing; and stripping the mask to lift off the bonding material thereon.

11. The method of claim 1, wherein said forming a perimeter comprises:

depositing the reactive foil onto the first wafer;

forming a photoresist layer atop the reactive foil;

patterning the photoresist layer to define a window; and removing a region of the reactive foil exposed through the window.

12. The method of claim 1, wherein the second wafer defines a hole, the method further comprising:

forming a second reactive foil and a second bonding material to be interposed between a device and the first wafer;

placing the device through the hole in the second wafer and onto the first wafer;

pressing the device and the first wafer against the second reactive foil and the second bonding material; and initiating the second reactive foil, the second reactive foil heating the second bonding material to create a second bond between the device and the first wafer.

13. The method of claim 1, wherein the first wafer includes a device at a first location and the second wafer defines a cavity at a second location opposite of the first location.

14. The method of claim 13, further comprising:

forming a second reactive foil and a second bonding material interposed between the device and the first wafer;

pressing the device and the first wafer against the second reactive foil and the second bonding material; and initiating the second reactive foil, the second reactive foil heating the second bonding material to create a second bond between the device and the first wafer.

15. The method of claim 1, further comprising:

forming a second perimeter comprising a second reactive foil and a second bonding material interposed between the second wafer and a third wafer;

pressing the second and the third wafers against the second reactive foil and the second bonding material; and initiating the second reactive foil, the second reactive foil heating the second bonding material to create a second bond between the second and the third wafers.

16. The method of claim 15, wherein the first wafer includes a device located at a first location and the second wafer defines a hole located at a second location opposite of the first location.

17. The method of claim 16, further comprising:

forming a third reactive foil and a third bonding material interposed between the device and the first wafer;

compressing the device and the first wafer against the third reactive foil and the third bonding material; and initiating the third reactive foil, the third reactive foil heating the third bonding material to create a third bond between the device and the first wafer.

18. The method of claim 1, wherein said forming a perimeter comprises:

forming the bonding material atop the first wafer; and forming the reactive foil atop of the bonding material.

19. The method of claim 18, wherein the perimeter further comprises a second bonding material, said forming a perimeter further comprising forming the second bonding material atop of the reactive foil.

20. The method of claim 1, wherein the said depositing alternating layers of reactive materials that forms a reactive foil comprises magnetron sputtering the alternating layers of reactive materials.

21. The method of claim 20, wherein the alternating layers of reactive materials comprises aluminum and nickel.

22. A method for bonding devices to wafers, comprising:

patterning a metal layer on a wafer to form metal lines;

depositing (1) alternating layers of reactive materials that form a reactive foil and (2) a bonding material on the metal lines;

patterning the reactive foil and the bonding material;

pressing a device and the wafer against the reactive foil and the bonding material; and initiating the reactive foil so the reactive foil undergoes an exothermic reaction that heats the bonding material, the heated bonding material creating a bond between the device and the metal layer on the wafer.

23. The method of claim 22, wherein the device is selected from the group consisting a MEMS (micro-eletromechanical systems) device, an electronic device, and an optoelectronic device.

24. The method of claim 22, wherein the said depositing alternating layers of reactive materials that forms a reactive foil comprises magnetron sputtering the alternating layers of reactive materials.

25. The method of claim 24, wherein the alternating layers of reactive materials comprises aluminum and nickel.

* * * * *

UNITED STATES PATENT AND TRADEMARK OFFICE
CERTIFICATE OF CORRECTION

PATENT NO. : 7,176,106 B2
APPLICATION NO. : 10/461291
DATED : February 13, 2007
INVENTOR(S) : Tanya Snyder It is certified that error appears in the above-identified patent and that said Letters Patent is hereby corrected as shown below:

Col. 6 line 29-30, delete "photaresist" and insert -- photoresist --, therefor.

Col. 6 line 42, delete "layers," and insert -- layers --, therefor.

Col. 7 line 8, delete "Conning" and insert -- forming --, therefor.

Col. 8 line 6, delete "Thc" and insert -- The --, therefor.

Col. 8 line 56-57, delete "eletromechanical" and insert -- electromechanical --, therefor.

Signed and Sealed this

Twenty-ninth Day of July, 2008

JON W. DUDAS
*Director of the United States Patent and Trademark Office*